United States Patent

Beery

[11] Patent Number: 4,768,050
[45] Date of Patent: Aug. 30, 1988

[54] PRESSURE DEVELOPMENT APPARATUS FOR IMAGING SHEETS EMPLOYING PHOTOSENSITIVE MICROCAPSULES

[75] Inventor: Jack Beery, Miamisburg, Ohio

[73] Assignee: The Mead Corporation, Dayton, Ohio

[21] Appl. No.: 39,393

[22] Filed: Apr. 16, 1987

[51] Int. Cl.$^4$ ............................ G03D 9/02; G03C 1/72
[52] U.S. Cl. ...................................... 354/304; 355/27; 430/138; 100/162 B
[58] Field of Search ..................... 354/86, 297, 304; 355/27; 430/138; 100/162 B

[56] References Cited

U.S. PATENT DOCUMENTS

| | | |
|---|---|---|
| Re. 321,264 | 4/1986 | Sasaki . |
| 2,191,144 | 2/1940 | Hornbostel . |
| 3,386,824 | 6/1968 | Miller ................................ 354/304 |
| 3,678,846 | 7/1972 | Bjorkegren . |
| 3,990,391 | 11/1976 | Singh . |
| 4,022,122 | 5/1977 | Moser et al. . |
| 4,145,965 | 3/1979 | Kikuchi et al. . |
| 4,192,229 | 3/1980 | Tsunoi et al. . |
| 4,235,166 | 11/1980 | Tsunoi . |
| 4,343,234 | 8/1982 | Sasaki . |
| 4,356,764 | 11/1982 | Haugen . |
| 4,602,408 | 7/1986 | Noe et al. . |
| 4,624,560 | 11/1986 | Beery ................................. 355/27 |
| 4,648,699 | 3/1987 | Holycross et al. .................. 355/27 |
| 4,714,943 | 12/1987 | Sakakibara et al. ................ 355/27 |
| 4,727,392 | 2/1988 | Stone et al. ....................... 354/304 |

Primary Examiner—A. A. Mathews
Attorney, Agent, or Firm—Biebel, French & Nauman

[57] ABSTRACT

A two-roll type pressure developer apparatus provides for the pressure development of a latent image formed on sheet material, and includes a first hollow pressure roll mounted on a support shaft which extends axially through the first roll and is in pressure-engagement to define a high pressure nip with a second roll. The support shaft forms a loading shaft through which the hollow or first roll is center-loaded. The rolls are carried in a support frame with the second roller being journalled in the frame, and the first roller being journalled on radius arms through non-self-aligning bearings on the arm ends. The arms in turn are mounted on bosses through self-aligning bearings. Loading springs apply a loading force directly to the loading shaft through the arms and journals so that the self-aligning bearings permit the arms to deflect during the shaft loading while the loading forces are carried by the non-self-aligning bearings. A working zone is established throughout which the nip pressure remains substantially uniform between the rolls, which working zone is somewhat less than the total width of the rolls, and pressure is relieved at the regions axially outwardly of the zones by an annular internal relief formed in the first roll in one embodiment and in the second roll in another embodiment.

10 Claims, 3 Drawing Sheets

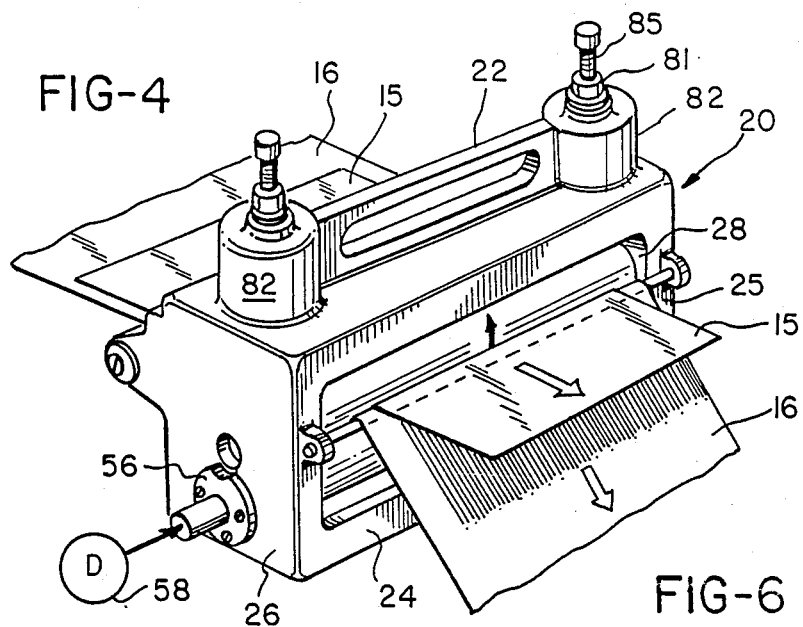
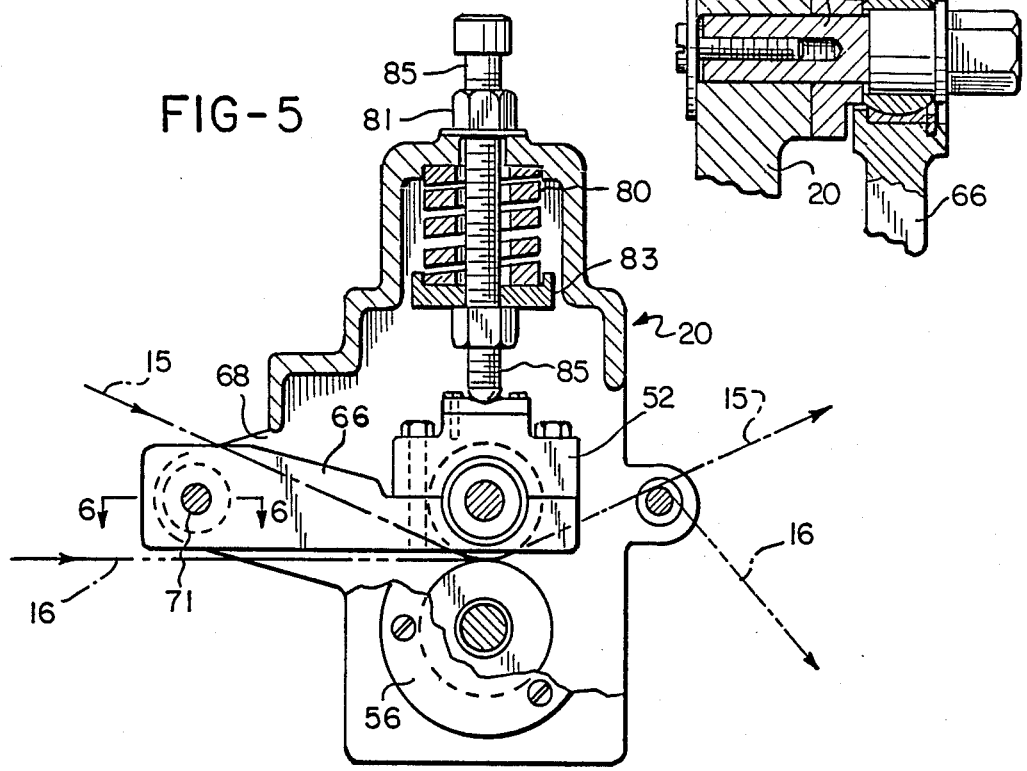

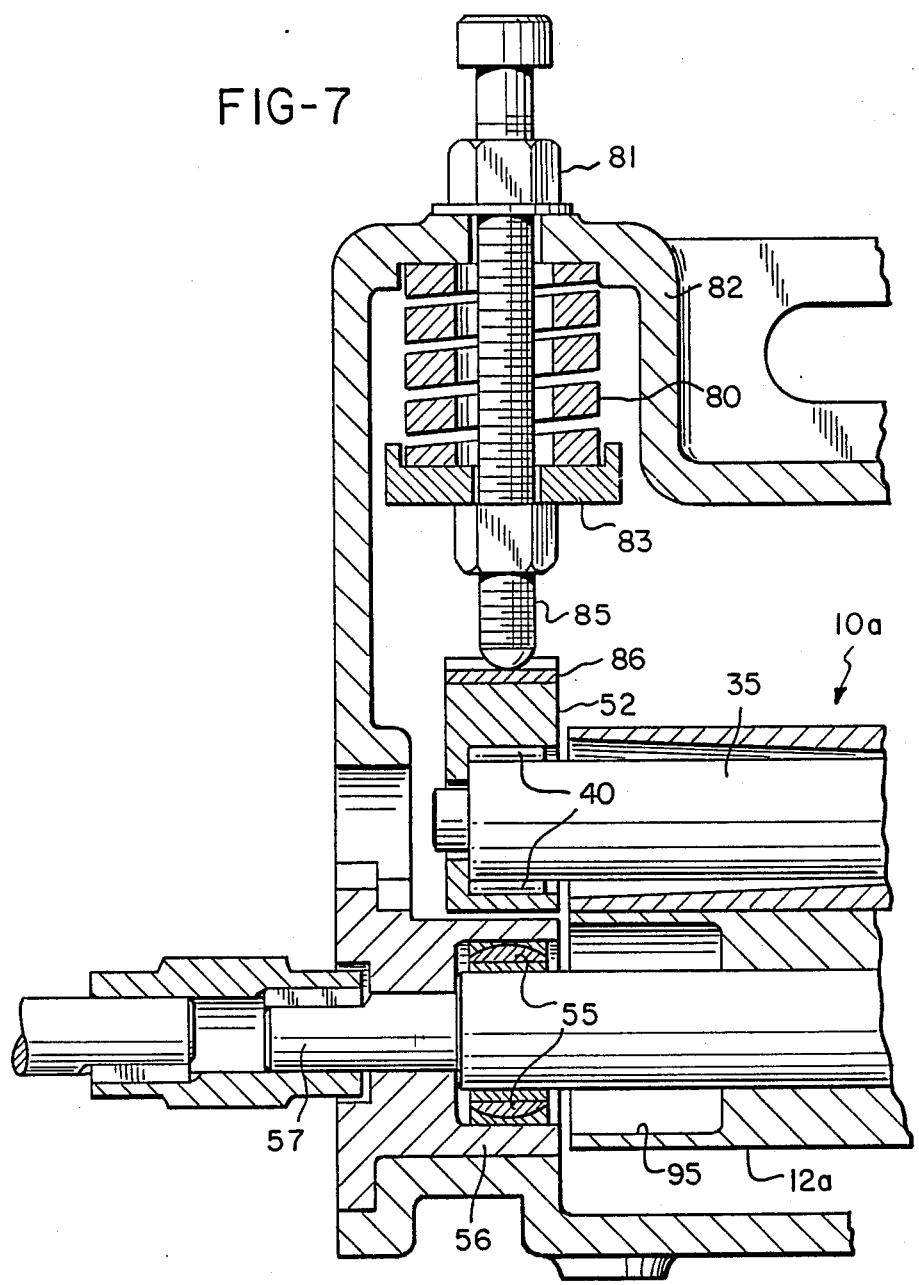

PRESSURE DEVELOPMENT APPARATUS FOR IMAGING SHEETS EMPLOYING PHOTOSENSITIVE MICROCAPSULES

BACKGROUND OF THE INVENTION

The invention relates generally to an imaging system utilizing imaging sheets having a surface coating of rupturable photosensitive microcapsules and, more particularly, to apparatus for rupturing the microcapsules on such imaging sheets.

U.S. Pat. Nos. 4,440,846 and 4,399,209, which are assigned to the same assignee as this invention, and which are herein incorporated by reference, describe an imaging system wherein a photosensitive layer, comprising microcapsules containing a photosensitive composition in the internal phase, is image-wise exposed to actinic radiation and subjected to a uniform rupturing force whereupon the microcapsules rupture and image-wise release the internal phase. The imaging system is particularly advantageous because it is a totally dry system and does not rely upon the application of wet developing processing solutions to produce the image. An image-forming chromogenic material, such as a substantially colorless color former, is typically associated with the microcapsules. When the microcapsules rupture, the color former image-wise reacts with the developer material and produces a color image. In the embodiments described in the referenced patents, the microcapsules are typically ruptured by passing image-wise exposed imaging sheets through the nip between a pair of parallel calender rolls.

The media may exist in either single-sheet or two-sheet versions. In the former case, the microcapsules and developer composition are both coated onto a single substrate layer. In the latter case, the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

While heavy pressure is not required to rupture the microcapsules, high pressure and large calender rolls are normally used to develop the imaging sheets. To normalize surface irregularities in the imaging sheets, substantial compression of the paper must be achieved. Thus, the use of large diameter rolls has been considered necessary to achieve a uniform distribution of the rupturing force across the surface of the imaging sheets. Otherwise, if the rupturing force is not uniformly distributed, the imaging sheets develop unevenly and the tonal characteristics of the resulting images are degraded.

One significant complication in applying apparatus for fixing fusible toner images to the development of microencapsulated media sheets is the relative magnitudes of pressure required. Typical pressure roll devices for fixing fusible toner images can apply approximately 1000 lbs/in$_2$. For the microencapsulated media, pressures of 6000 to 8000 lbs/in$_2$ are required.

In pressure fixation apparatus for fixing a dry pressure fusible toner image onto a sheet of paper, it is known to use a pair of pinch rolls biased toward each other and disposed such that the axis of one roll extends at an angle relative to the axis of the other. This skewed arrangement tends to minimize irregularitres of the nip between the rolls even when a paper sheet passes therebetween. However, when the skew angle is too large, creases or wrinkles are formed in the paper sheet. In order to avoid such wrinkles in the sheet, the skew angle is kept quite small. With a small skew angle, however, the rolls again must have large diameters to ensure uniform pressure along the nip due to the bending of the rolls. In addition to the added weight of the larger rolls, the loading pressure must also be increased. Hence, larger pressure mechanisms, higher compression resistant bearings, housings and so forth lead to an increased cost for the apparatus.

To overcome these difficulties in the art of fixing fusible toner images, three roll systems have been used. Such a system is shown in U.S. Pat. No. 4,343,234. In one three roll system, the two upper rolls form a pair of pinch rolls which are disposed parallel and horizontal with a slight skew angle therebetween. A third back-up roll is disposed in a crossing contact relation to the second roll. The back-up roll is biased resiliently upwards toward the second roll of the pair of pinch rolls by a pressure mechanism such that the second roll is butted against the first roll under pressure to form a nip along their contacting line through which paper sheets pass. The bending of the second roll can be adjusted by the cross angle of the back-up roll relative to the second roll such that both the second roll and the back-up roll may have a smaller diameter than the first roll. Even in this case, however, the skew angle between the nip rolls must still be relatively small to avoid wrinkling of the sheets.

A particular inherent disadvantage of such prior art fixing or developing systems resides in the fact that the pressure across the nip is uniform only at one design pressure, and variations in the thickness of the material passing through the nip or variations in the pressure applied to the nip, causes a departure from a condition of linearity across the nip.

Improved pressure development apparatus for imaging sheets employing photosensitive microcapsules, as described above, are disclosed in co-pending application Ser. No. 009,851 filed Feb. 2, 1987, now U.S. Pat. No. 4,727,392, incorporated herein by reference. In the co-pending application, the problems introduced by skew angles at the nip or by differential roll speeds at the nip caused by crowned rolls are eliminated by the employment of separate crown rolls which coact with the pressure rolls. This allows the pressure rolls to be cylindrical and free of skew angle and free of differential surface speeds at the nip. Also, improved sheet feed arrangements are disclosed by which the sheet material may advantageously be applied to the pressure rolls in such a manner as to reduce the tendency for wrinkling of the imaging or donor sheets.

In spite of the improvements which have been made to high pressure roll development apparatus, there exists a need for apparatus which is lighter in weight, which is capable of providing a substantially uniform nip pressure throughout a design width of the roll over varying thicknesses of sheet material and over varying overall loadings on the rolls, and to provide a roll-type pressure developer which is inherently capable of applying a uniform pressure across a nip, over long periods of time, with a minimum of maintenance requirements.

SUMMARY OF THE INVENTION

This invention is directed to apparatus for forming images on imaging sheet material, such as sheet material, in which microcapsules contain a photosensitive composition which undergo a change in viscosity upon exposure to actinic radiation, and more particularly to a roll-type pressure developer in which a latent image on sheet material is developed by passing the sheet material between the nip of a pair of cylindrical pressure rollers which exert a high localized pressure along the nip on the sheet material. The invention is particularly adapted to the apparatus in which the pressure between the nip is controlled throughout a working zone corresponding generally to the width of the web or sheet to be passed therethrough, and which is particularly adapted to provide for reduced or zero loading at axial locations outside of the working zone.

In the realization of the objectives as set out above, a pair of pressure rolls are employed, which may be considered as comprising first and second pressure rolls. One of these pressure rolls, such as the first pressure roll, is hollow in that it is formed as an annular shell. This pressure roll incorporates or includes a loading shaft which extends axially through the roll, which shaft is joined to the hollow shell at a central region only of the sheet, and which shaft clears the inside of the shell at all other regions. The remote ends of the loading shaft preferably extend axially beyond the shell for suitable journalling in a journal block and for pressure loading.

The two-roll system has the advantage over a three- or four-roll system in that it is less susceptible to the effects of dirt on the rolls.

The second roll, which may advantageously be approximately the same diameter as that of the first roll, may be conventionally formed of solid material and likewise provided with journalled ends by means of which the second roll is mounted in parallel relation to the axis of the first roll, and journalled for rotation.

The total width of the pressure rolls at the region of contact therebetween defines a nip which is somewhat wider than the sheet material. It is desirable to provide apparatus in which the pressure loading between the rolls is unloaded at regions axially outside of the desired working zone, corresponding to the width of the sheet material. Such unloading, in the present invention, is accomplished by forming an inside relief, corresponding to the regions to be unloaded, in one or the other of the pairs of pressure rolls.

Since the hollow pressure roll is center-loaded, a uniform force may be created between the roll pairs by suitably tapering the wall thickness of the first roll from a maximum thickness at the central region to a lesser thickness at the axial outer portions of the working zone thereof. The degree or rate of taper must take into account the fact that the first and second rolls, when loaded by a force applied to the loading shaft of the first roll, will deflect or bend together along a common deflection curve and opposite to the camber of the loading shaft. Since the remote opposite journalled ends of the loading shaft will undergo physical deflection under conditions of loading, it is desirable to journal these ends in suitable bearing blocks employing non-aligning bearings, in such a way that the bearing blocks themselves may deflect and twist as the axis therethrough is deflected. In order to accommodate this advantageously, the bearing blocks themselves are mounted on short radius arms, which arms, in turn, are mounted to the support frame through conventional non-load carrying self-aligning bearings. In this manner, the trunion bearings for the loading shaft are not required to accommodate bending or deflecting movements of the shaft during loading and during operation, and the self-aligning bearings are not required to carry the pressure load.

The moment of inertia of the center-loaded roll, may be varied by suitably tapering, stepping or or contouring the internal portion of this roll outwardly of the central support region, so that a near uniform curve can be obtained considering the two rolls together. The slight curvature in the nip as defined by the rolls provides a camber which may be advantageously employed, by causing the web or sheet material to follow a path which partially wraps about the first or hollow roll, so that a slight spreading tends to occur in the web or sheet material, thereby providing stability for the sheet material and avoiding any tendency for wrinkling.

It is accordingly an important object of this invention to provide an improved two-roll pressure developer apparatus, of the type disclosed.

A further object of the invention is the provision of a two-roll high-pressure type developer type developer, which provides relatively uniform loading throughout a working portion of the nip and throughout variations in roll loading such as may be caused by variations in the thickness of the sheet material therebetween.

A further object of the invention is the provision of a reliable two-roll type press, which is capable of relatively high unit loading pressures while providing linearity throughout a working zone, in which the rolls move at the same surface speed at the nip, and in which axially terminal regions of the engaging rolls, outside of the working zone, are unloaded.

A further object of the invention is the provision of a two-roll pressure developer for applying a uniform pressure across a nip in which one of the rolls is hollow and is mounted at a central region on a loading shaft, and in which the journalled ends of the loading shaft are mounted on arms which provide for self-aligning movement of the journalled ends to accommodate bending of the shaft in relation to the axis of the hollow roll, accompanied by twisting movement of the arms.

A further object of the invention is the provision of a two-roll sheet developer with camber which applies a spreading force to the sheets.

These and other objects and advantages of the present invention will be apparent from the following description, the accompanying drawings, and the appended claims.

BRIEF DESCRIPTION OF THE DRAWINGS

FIG. 4 is a perspective view of a two-roll pressure developer made according to this invention;

FIG. 5 is an enlarged partially broken away end view of the apparatus of FIG. 4, showing the roll mounting arm and spring loading arrangement;

FIG. 6 is a fragmentary sectional view showing the mounting of the support arm to the frame, taken generally along the line 6—6 of FIG. 5; and FIG. 7 is an enlarged fragmentary transverse sectional view through the pressure developer showing the preferring arrangement for mounting and driving the pressure rolls and for applying a loading force thereto.

DETAILED DESCRIPTION OF PREFERRED EMBODIMENTS

Figure 1:
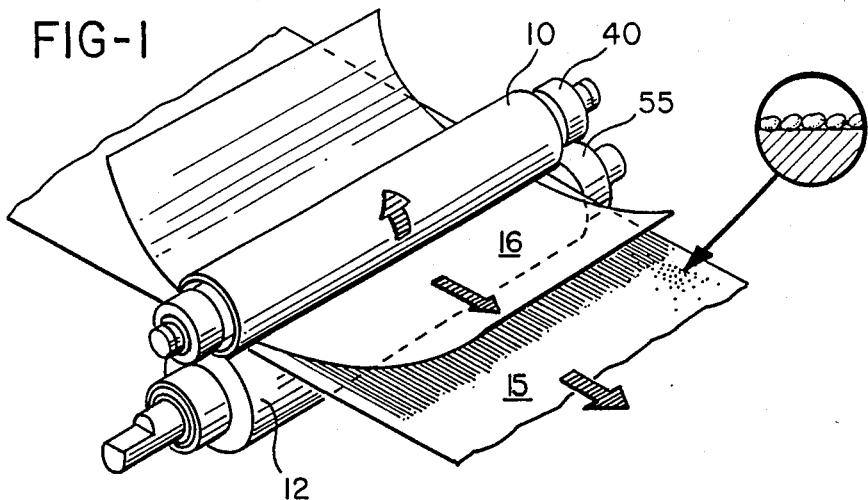
FIG. 1 is a perspective view showing a pair of rolls constructed according to this invention with sheet material applied therebetween.

Referring to the drawings which illustrate preferred embodiments of the invention, FIGS. 1 and 4 illustrate a two-roll pressure type developer which includes a first roll 10 and a second roll 12 mounted in parallel to each other, and receiving sheet material therebetween. As illustrated in FIGS. 1 and 4, the sheet material may consist of a single sheet, but preferably consists of a donor sheet 15 and a receiver sheet 16 made in accordance with the teachings of U.S. Pat. No. 4,399,209 issued Aug. 16, 1983. In accordance with the teachings of that patent, images are form by exposing a coated composition containing a chromogenic material and the encapsulated photosensitive composition to actinic radiation, and thereafter rupturing the capsules in the presence of a developer carried on the receiver sheet. The capsules are ruptured by the application of a high uniform pressure in the nip between a pair of rolls, as more fully explained in the co-pending application Ser. No. 009,851.

Due to the high linear unit forces involved, it is important that the roll-type developer operate without differential slippage at the nip which could tend to cause the web to wrinkle. It is also important that the pressure is developed uniformly throughout a working zone of the nip, and that the pressure is relieved at regions axially outwardly of the working zone.

The pressure developing rolls 10 and 12 are mounted for rotation in a frame or housing illustrated generally at 20 in FIGS. 4 and 5. The housing structure may, advantageously, be provided with a top 22, a bottom 24, and a pair of spaced-apart side frame members 25 and 26. The housing 20 includes a central opening 28 therethrough for passage of the sheets.

Figure 2:
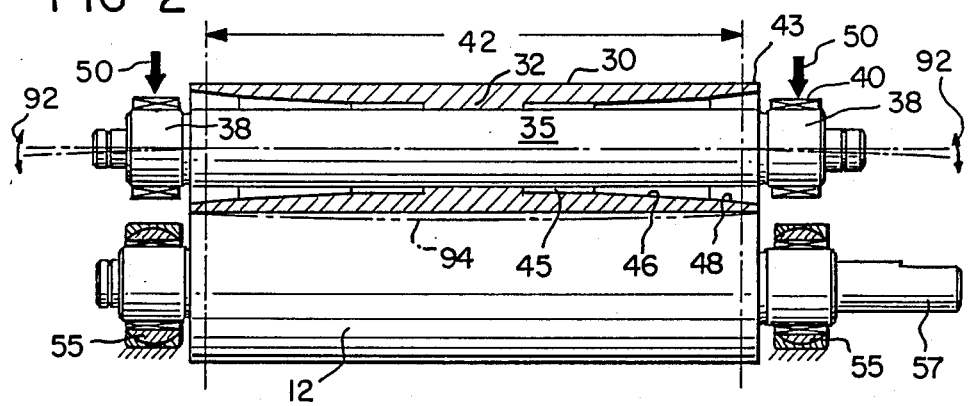
FIG. 2 is an elevated view of the roll pairs showing the first roll in section.

As shown in FIG. 2, the roll pair includes the first roll 10 which is hollow, or formed like a shell, providing a cylindrically true outer surface 30, and having an axially central part defining a loading region 32. A loading shaft 35 extends axially through the roll 10. The loading shaft 35 is a support shaft, and is joined to the roll 10 exclusively at the central loading region 32 thereof, and extends axially of the shell in non-contacting relation from the region 32. Preferably, the shaft 35 is permanently attached to the surrounding shell portion of the roll 10 at the central region 32, and it is important that this attachment does not permit the roll to walk or creep with respect to the loading shaft during loading and flexing. For this purpose, the shaft 35 and roll 10 may be connected by copper brazing. The remote ends of the loading shaft 35 extend beyond the roll and define bearing surfaces 38 which receive non-aligning, thrust transmitting low-friction bearings, such as roller bearings 40 (FIG. 2).

The second roll 12 which may be solid, as shown, is rotatably mounted in the housing 20 in nip-defining relation to the roll 10. It will be seen that the roll pairs are somewhat wider than the sheet or web material to be applied thereto. In FIG. 2, the span at 42 represents the working zone of the rolls which, for example, may be 8½", thereby leaving small non-working regions 43 at the axially remote ends of each of the pressure rolls.

It will be noted, in reference to FIG. 2, that the interior surface of the roll 10 is partially tapered, leading first from a relatively straight section 45, including an intermediate tapered section 46 and an end relief section 48. The taper provides for the controlled deflection of the shell portion of the roll 10 when loaded by the application of a downward force, in the direction of the arrows 50, on the bearings 40 at the ends of the roll, as illustrated in FIG. 2. The taper or contouring of the internal surface of the roll 10 provides for control of the moment of inertia, such that an approximately uniform pressure distribution may be defined along the nip between the roll pairs throughout the working zone 42. The matching of the rolls 10 and 12 is affected by considering the basic theory of beam bending, the deflections caused by shear stresses, the changes in cross-section at axial nodal positions, and the local effects consisting of deflections of the thin-walled portion of the roll 12. It has been found helpful to utilize the finite element analysis method in calculating the expected deflections.

The rolls 10 and 12 are cylindrical, and are mounted in the housing 20 parallel to each other. As previously noted, the roll 10 is mounted for rotation in bearings 40 which, in turn, are carried in journal blocks 52, as best shown in the sectional view of FIG. 7. Similarly, the extended ends of the roll 12 are mounted on self-aligning bearings 55, in relatively fixed journal blocks 56. The one end of the roll 12 is formed with a shaft extension 57 by means of which connection may be made to a drive motor 58 diagrammatically illustrated in FIG. 4.

The journal blocks 52 are each mounted on the end of one radius arm 66, as shown in FIG. 5. The arms 66 are, in turn, pivotally mounted to the sides 25 or 26 of the frame 20, through self-aligning bearings 70, as shown in FIG. 6. The bearings 70 are carried on stud bolts 71 extending inwardly from the side walls of the frame 20, and are received within suitable enlarged ends 66' of the arm 60.

The roll 10 is loaded by loading on the journals 52, which transmit a loading force through the bearings 40 to the remote ends of the loading shaft 35 of the roll 10. As best shown in FIG. 7, loading springs 80 are positioned within spring housing portions 82 of the housing 20 and bear against a thrust collar 83. The force of the spring 80 is transmitted by the collar to a threaded pressure rod 85, the lower end of which is in pressure engagement with a hardened upper surface 86 of the bearing block 85. The upper end of the rod 85 extends above the spring housing portion 82 and is adjustable on a nut 87 for varying the effective length of the rod 85. While the mounting and loading arrangement is shown for one end of the roll 10, it is understood that a substantially identical arrangement is provided for the other end of the roll.

The loading of the shaft 35 results in the deflection of the shaft ends, as illustrated by the arrows 92 in FIG. 2. This deflection results in an arcuate and tilting movement of the bearing blocks 52 which is transmitted through the radius arms 66 to the self-aligning bearings 70. Accordingly, the arms 66 and bearings 70 provide for the twisting movement which is accompanied by the deflection or bending of the loading shaft 35, thereby permitting a straight or non-self-aligning bearing 40 to be used as the primary thrust transmitting element, and permitting a low cost self-aligning bearing 70 to be employed which does not carry the loading thrust. However, self-aligning bearings 55 have been found satisfactory for supporting the second roll 12 for rotation within the housing or frame 20, since the actual deflection 92 of this roll, as seen at the ends thereof, is substantially less than the deflection of the loading shaft 35 as seen at its trunion ends.

For proper operation, the rolls of the forming apparatus should have a high hardness. While mild steel may be satisfactory for some applications, the rolls must be protected against damage in the event of paper jams, where double or quadruple fold-overs and the like, can very substantially increase the localized loading of the rolls. For the purpose of the present invention, the rolls may be loaded in the region of 500 pli (89 Kg/cm) which, in typical 9" rolls as illustrated, loaded over 8.5 inches requires a load of 2,125 pounds (964 Kg), applied by the spring 30 at the journal ends. The relief defined by the second taper 48, extending to the terminal edge of the roll 10, assures that the rolls become substantially unloaded at regions axially outside of the working zone 42.

In the specific example given, without in any way intending to limit the scope of the invention, the rolls 10 and 12 may have a nominal length of 9.0", and a working zone length of 8.5", with the first roll 10 having a nominal diameter of 1.98", and the second roll 12 having a nominal diameter of 2.39". The loading shaft 35 is of substantially uniform diameter throughout its length, with a diameter of 1.30". The central loading region may extend axially for 1.6", while the relatively cylindrical or straight sections 45 of the relief each have an axial length of 0.616". The intermediate tapered portions 46 each have a length of 2.351" and a taper of 0.1049" to 1.0". The second relief 48 is an axial length of 0.733" and a taper of 0.3306" to 1.0". While a single intermediate tapered portion is shown, the result of the taper may be achieved in different ways, including the formation in the inside surfaces of a stepped pattern, in which the wall thicknesses are varied in stepped increments.

Surface hardnesses in the order of 60 Rockwell C is considered to be preferred. The rolls may thus be case hardened to a depth of at least 0.049" (1.25 mm), and hard chromium plating applied to the exposed outer surfaces, to a thickness of at least 0.002" (0.05 mm) for protection against rust.

When the rolls are loaded, as illustrated in FIG. 2, a camber will be formed in the rolls, as shown by the broken line 94, and the nip therebetween will not be in a straight line, but rather will be curved. For the purpose of discussion, it maY be assumed that a positive camber is formed in roll 10 and a negative camber formed in roll 12. It is thus preferred that the sheet material at least partially wrap the hollow roll 10 so that the sheet material will be transversely stretched slightly by the cambers as it enters and leaves the nip, thereby avoiding tendencies to wrinkle. If desired, the sheet feed mechanism as disclosed in copending application Ser. No. 009,851 may be used.

Figure 3:
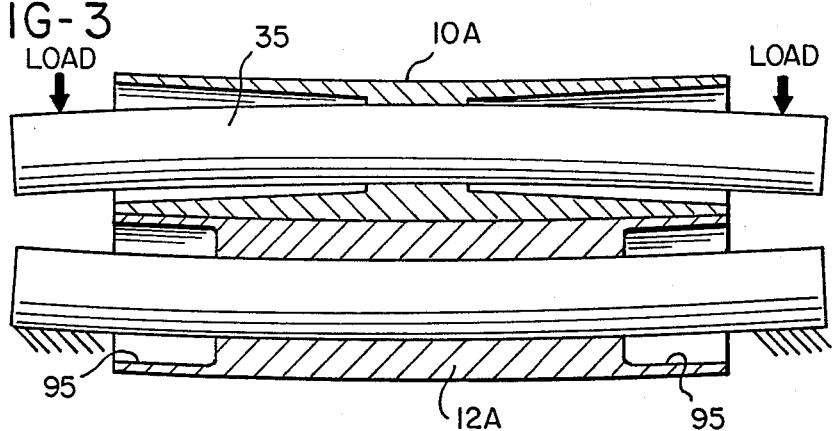
FIG. 3 is a view similar to FIG. 2, showing a slightly modified form of the invention.

FIGS. 3 and 7 represent a slightly modified form of the invention, in which like parts are illustrated by like reference numerals with the addition of the letter $a$. The hollow roll 10$a$ cooperates with the bottom roll 12$a$. In this embodiment, the relief as previously defined by the second taper 48 is eliminated, and an internal axial annular relief 95 is formed at the opposite ends of the roll 12 and extends axially inwardly an amount corresponding approximately to the axial extent of the previous taper 48 The annular relief defined at 95 in FIG. 3 serves the same function as previously described in connection with the annular relief defined by the taper 48 to relieve the pressure at the terminal end or regions of the rolls.

A particular advantage of the two-roll system of this invention is that the loading across the nip will remain substantially uniform over a wide range of total loading forces, and is thus relatively unaffected by variations in the thicknesses of the sheet material as far as uniformity is concerned. Further, truly cylindrical rolls are used, thereby eliminating the need for crowning and/or skewing, as in prior arrangements.

While the forms of apparatus herein described constitute preferred embodiments of this invention, it is to be understood that the invention is not limited to these precise forms of apparatus, and that changes may be made therein without departing from the scope of the invention which is defined in the appended claims.

What is claimed is:

1. In a roll-type pressure developer in which an image on sheet material is developed by passing the sheet material between the nip of first and second cylindrical pressure rolls to exert a high localized pressure on the sheet material across a zone corresponding to the width of said material and in which the pressure rolls have a length which exceeds the width of said zone, the improvement for the uniform loading of the pressure rolls, comprising:

said first pressure roll being hollow and having an inside surface, a loading shaft extending generally through said first pressure roll and joined with said roll at the axial central region of said roll and extending axially outwardly from each side of said central region in non-contacting relation to said roll, means journalling said loading shaft at the ends thereof outwardly of said first roll in nip-forming relation with said second roll, force means acting on the journalled ends of said shaft for pressure-loading said rolls together, and internal relief means in one of said rolls axially outwardly of said zone for substantially relieving pressure between said rolls at regions thereof axially outwardly of said zone.

2. The roll-type pressure developer of claim 1 in which said last-name means comprises peripheral reliefs formed in said first roll inside surface.

3. The roll-type pressure developer of claim 1 in which said last-named means comprises peripheral reliefs formed at the axial ends of said second roll.

4. The roll-type pressure developer of claim 1 in which said first roll-mounting means includes non-aligning journals joining the ends of said loading shaft, arm means supporting said journals and providing for twisting movement with bending of said loading shaft.

5. A two-roll pressure developer for applying a uniform pressure to paper stock across a nip, in which the width of the rolls excees the width of paper stock to be developed therebetween, comprising:

a first pressure roll in the form of an annular shell, support means for said first roll including a loading shaft extending through said shell, means on a central portion of said shaft joining said shaft to said shell at a corresponding central portion of said shell, said shaft extending axially of said shell from said central portion in non-contacting relation to said shell, providing cantilever support for said shell, a second pressure roll, means mounting said second roll for rotation,
means mounting said shaft at the ends thereof for rotation with said first roll in pressure contact with said second roll,
said mounting means including a pair of support arms,
journal means on said arms rotatably supporting said shaft and providing for pressure transfer from said arms to said shaft,
self-aligning mounting means for said arms providing for twisting movement of said arms with the bending of said shaft, and
loading means engaging said shaft for pressure loading said nip.

6. The two-roll pressure developer of claim 5 including a support frame for said rolls, means mounting said second roll for rotation in said frame, and self-aligning bearing means mounting said arms on said frame.

7. The two-roll pressure developer of claim 5 in which at least one of said rolls is formed with an annular relief at the ends thereof for defining the extent of pressure contact along said nip to a zone corresponding to a width of said paper stock.

8. Roll-type pressure fixing and developing apparatus in which sheet material to be treated is passed through a high pressure nip defined by a pair of rolls carried in frame means, comprising:
a first hollow roll,
a loading shaft extending through said hollow roll,
means joining said shaft to said hollow roll exclusively at an axial central loading region of said hollow roll,
a second roll,
frame means mounting said second roll for rotation for pressure engagement with said first roll defining said nip,
first roll support means including bearing blocks journalled on the ends of said shaft and providing a thrust-loading connection between said frame means and said shaft, including arm means pivotally mounting said bearing blocks on said frame means.

9. The apparatus of claim 8 in which the axial lengths of said rolls exceed the transverse width of said sheet material, and annular internal relief means defined in the axial ends of at least one of said rolls for defining said pressure nip contact to an axial zone corresponding generally to the width of said sheet material.

10. The apparatus of claim 8 in which a positive camber is formed in said first roll accompanied by a corresponding negative camber in said second roll, said positive camber providing a spreading action to sheet material partially wrapped about said first roll as said sheet material passes through said pressure nip.

* * * * *